(12) United States Patent
Laurence

(10) Patent No.: US 9,599,722 B2
(45) Date of Patent: Mar. 21, 2017

(54) LARGE-AREA SCINTILLATOR ELEMENT AND RADIATION DETECTORS AND RADIATION ABSORPTION EVENT LOCATING SYSTEMS USING SAME

(71) Applicant: KONINKLIJKE PHILIPS N.V., Eindhoven (NL)

(72) Inventor: Thomas Leroy Laurence, North Royalton, OH (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 7 days.

(21) Appl. No.: 14/787,660

(22) PCT Filed: May 4, 2014

(86) PCT No.: PCT/IB2014/061183
§ 371 (c)(1),
(2) Date: Oct. 28, 2015

(87) PCT Pub. No.: WO2014/181232
PCT Pub. Date: Nov. 13, 2014

(65) Prior Publication Data
US 2016/0084963 A1    Mar. 24, 2016

Related U.S. Application Data

(60) Provisional application No. 61/821,747, filed on May 10, 2013.

(51) Int. Cl.
*G01T 1/164* (2006.01)
*G01T 1/29* (2006.01)
*H01L 27/146* (2006.01)

(52) U.S. Cl.
CPC .......... *G01T 1/1644* (2013.01); *G01T 1/2985* (2013.01); *H01L 27/14663* (2013.01); *H01L 27/14685* (2013.01); *H01L 27/14689* (2013.01)

(58) Field of Classification Search
CPC ................ G01T 1/1644; G01T 1/2985; H01L 27/14663; H01L 27/14685; H01L 27/14689
(Continued)

(56) References Cited

U.S. PATENT DOCUMENTS 3,978,336 A   8/1976   Roux
5,227,633 A   7/1993   Ryuo et al.
(Continued)

FOREIGN PATENT DOCUMENTS

DE   2500643 A1   7/1975
EP   0437051 A2   12/1990
WO   9323769 A1   11/1993

OTHER PUBLICATIONS

Li, X., et al.; A High Resolution, Monolithic Crystal, PET/MRI Detector with DOI Positioning Capability; 2008; Conf. Proc. IEEE Eng. Med. Biol. Soc.; 2287-2290.
(Continued)

*Primary Examiner* — David Porta
*Assistant Examiner* — Gisselle Gutierrez

(57) ABSTRACT

A scintillator element (22) includes scintillator blocks (60) arranged to form an array, and transparent or translucent material (62) disposed between adjacent scintillator blocks of the array. The transparent or translucent material may comprise epoxy or glue disposed between adjacent scintillator blocks of the array and adhering the adjacent scintillator blocks together. In some embodiments the scintillator blocks have a refractive index for scintillation light of at
(Continued)

least •=1.8, and the transparent or translucent material has a refractive index for the scintillation light of at least •=1.6. An array of light detectors (24), such as silicon photomultipliers (SiPM) detectors formed monolithically on a silicon substrate, may be disposed on a bottom face of the scintillator element to detect scintillation light generated in the scintillator element. For PET applications, the scintillator element and the array of light detectors define a radiation detector (20) configured to detect 511 keV radiation.

26 Claims, 4 Drawing Sheets

(58) Field of Classification Search
USPC .......................................................... 250/362
See application file for complete search history.

(56) References Cited

U.S. PATENT DOCUMENTS

| | | | |
|---|---|---|---|
| 6,403,960 B1 | 6/2002 | Wellnitz et al. | |
| 6,744,052 B1 | 6/2004 | Petersson et al. | |
| 7,157,014 B1 | 1/2007 | Andreaco et al. | |
| 8,598,529 B2* | 12/2013 | Perna | G01T 1/2002 250/361 R |
| 2003/0178570 A1* | 9/2003 | Tsunota | G01T 1/2002 250/370.11 |
| 2005/0087693 A1* | 4/2005 | Sumiya | G01T 1/2928 250/367 |
| 2008/0156993 A1* | 7/2008 | Weinberg | A61B 6/12 250/363.03 |
| 2009/0159804 A1* | 6/2009 | Shibuya | G01T 1/2985 250/363.03 |
| 2010/0032578 A1* | 2/2010 | Levene | G01T 1/1644 250/370.11 |
| 2010/0127178 A1* | 5/2010 | Laurence | G01T 1/202 250/363.04 |
| 2010/0148074 A1* | 6/2010 | Menge | G01T 1/1644 250/362 |
| 2010/0176301 A1* | 7/2010 | Wieczorek | G01T 1/1642 250/363.02 |
| 2010/0230605 A1 | 9/2010 | Partouche-Sebban et al. | |
| 2012/0001078 A1* | 1/2012 | McEvoy | G01T 1/2002 250/366 |
| 2013/0009067 A1 | 1/2013 | Schmand et al. | |
| 2013/0299707 A1* | 11/2013 | Levin | G01T 1/164 250/363.03 |
| 2014/0061481 A1* | 3/2014 | Kondo | G01T 1/2012 250/361 R |
| 2014/0166887 A1* | 6/2014 | Murphy | G01T 1/2018 250/366 |
| 2015/0059963 A1* | 3/2015 | Nitta | G01T 1/20 156/154 |
| 2015/0177386 A1* | 6/2015 | Griesmer | G01T 1/1612 250/363.03 |
| 2015/0192685 A1* | 7/2015 | Griesmer | G01T 1/1647 250/362 |
| 2015/0276953 A1* | 10/2015 | Espana Palomares | G01T 1/1648 702/104 |

OTHER PUBLICATIONS

Miyaoka, R. S., et al.; Design of a High Resolution, Monolithic Crystal, PET/MRI Detector with DOI Positioning Capability; 2008; onf. Proc. IEEE Eng. Med. Biol. Soc.; 4688-4692.

* cited by examiner ized as a monolithic array on a silicon wafer or chip, along with interconnect traces and optional signal processing electronics. SiPM arrays can provide analog or digital outputs, and timestamp circuitry can be integrated with the monolithic array. Additionally or alternatively, signal processing circuitry can be disposed with the monolithic SiPM array (e.g. as part of the PET detector ring, or in the detector head of a gamma camera used in SPECT imaging) as separate integrated circuit (IC) chips mounted on a common or neighboring printed circuit board.

LARGE-AREA SCINTILLATOR ELEMENT AND RADIATION DETECTORS AND RADIATION ABSORPTION EVENT LOCATING SYSTEMS USING SAME

CROSS REFERENCE TO RELATED APPLICATIONS

This application is a national filing of PCT application Serial No. PCT/IB2014/061183, filed May 4, 2014, published as WO 2014/181232 A1 on Nov. 13, 2014, which claims the benefit of U.S. provisional application Ser. No. 61/821,747 filed May 10, 2013, which is incorporated herein by reference.

BACKGROUND

The following relates to the radiation detector arts, nuclear imaging arts, and related arts.

Radiation detectors for use in positron emission tomography (PET), single-photon emission computed tomography (SPECT), and other nuclear imaging techniques sometimes employ a combination of a scintillator crystal that converts a radiation particle (e.g. 511 keV gamma ray, in the case of PET imaging) to a burst of light (i.e. scintillation light) in conjunction with a light detector arranged to detect the scintillation light. In a radiation detector array, photomultiplier tubes (PMT's) have conventionally been used as the light detectors. However, solid state light detectors such as silicon photomultiplier (SiPM) devices have performance and compactness advantages. A SiPM employs a silicon avalanche photodiode (APD) as the sensing mechanism where the APD is operated in Geiger mode for PET and SPECT applications. SiPM detectors can be manufactured as a monolithic array on a silicon wafer or chip, along with interconnect traces and optional signal processing electronics. SiPM arrays can provide analog or digital outputs, and timestamp circuitry can be integrated with the monolithic array. Additionally or alternatively, signal processing circuitry can be disposed with the monolithic SiPM array (e.g. as part of the PET detector ring, or in the detector head of a gamma camera used in SPECT imaging) as separate integrated circuit (IC) chips mounted on a common or neighboring printed circuit board.

In nuclear imaging, a radiation particle absorption event is localized to the detecting radiation detector. For improved spatial resolution, a depth of interaction (DOI) algorithm can be applied to approximate the depth within the scintillator at which the radiation particle was absorbed. DOI techniques can improve resolution and reduce noise by correcting for parallax effects when the radiation particle path has a large component oriented along (i.e. parallel with) the face of the radiation detector.

Various improvements are disclosed herein.

According to one aspect, a scintillator element includes N scintillator blocks of thickness t arranged to form an array of thickness t, and transparent or translucent material disposed between adjacent scintillator blocks of the array. The transparent or translucent material may comprise epoxy or glue disposed between adjacent scintillator blocks of the array and adhering the adjacent scintillator blocks together. Preferably, no reflective or opaque material is disposed between adjacent scintillator blocks of the array. In some embodiments the N scintillator blocks of the array are capable of generating scintillation light responsive to absorption of a radiation particle and have a refractive index for the scintillation light of at least n=1.8, and the transparent or translucent material disposed between adjacent scintillator blocks of the array has a refractive index for the scintillation light of at least n=1.6. By way of example, the N scintillator blocks may be N blocks of LSO, BGO, GSO, or LYSO. A reflective layer may be disposed on a top face of the scintillator element over all N scintillator blocks of the array, and an array of light detectors (e.g., an array of silicon photomultiplier detectors formed monolithically on a silicon substrate) may be disposed on a bottom face of the scintillator element and arranged to detect scintillation light generated in the scintillator element. For PET applications, the scintillator element and the array of light detectors define a radiation detector configured to detect 511 keV radiation.

According to another aspect, an imaging system includes a radiation detection component and an image reconstruction processor comprising an electronic data processing component configured to reconstruct an image from radiation data acquired by the radiation detection component. In this embodiment, the scintillator element and the array of light detectors define at least one radiation detector of the radiation detection component of the imaging system. In some embodiments, the imaging system is a PET imaging system or a SPECT imaging system. The imaging system may include a depth of interaction (DOI) processor comprising an electronic data processing component configured to estimate the depth over the thickness t of the scintillator element at which a radiation absorption event occurred based on detection by the array of radiation detectors of scintillation light generated in the scintillator element by the radiation absorption event. The imaging system may include a position processor comprising an electronic data processing component configured to locate a radiation absorption event based on detection by the array of radiation detectors of scintillation light generated in the scintillator element by the radiation absorption event. By way of example, the position processor may be configured to locate the radiation absorption event using Anger logic.

According to another aspect, a scintillator element is constructed by operations including: dicing a scintillator wafer or puck to generate scintillator blocks of thickness t; assembling N of the scintillator blocks of thickness t to form an array of thickness t; and disposing transparent or translucent material between adjacent scintillator blocks of the array. The transparent or translucent material may be a bonding material, and the disposing may comprise bonding adjacent scintillator blocks of the array together using the transparent or translucent bonding material. In another approach, the assembling may include bonding the N scintillator blocks to a common substrate, such as a monolithic array of SiPM light detectors. In some embodiments, the dicing operation generates at least 2N scintillator blocks and the assembling and disposing operations are repeated R times to construct R scintillator elements, where R is greater than or equal to two.

According to another aspect, a method comprises: generating scintillation light in a scintillator comprising N scintillator blocks bonded together to form an optically continuous scintillator element responsive to a radiation absorption event occurring in the optically continuous scintillator element; detecting the scintillation light using an array of light detectors; and locating the radiation absorption event in the optically continuous scintillator element based on the detected scintillation light, wherein the locating employs an algorithm treating the optically continuous scintillator element as an optically continuous light transfer medium. The locating may include applying a depth of interaction (DOI) algorithm to locate the radiation absorption event over a thickness t of the optically continuous scintillator element.

According to another aspect, an optically continuous scintillator element comprises N scintillator blocks bonded together to form an optically continuous light transfer medium. Preferably, no reflective or opaque material is disposed between adjacent scintillator blocks. In some embodiments the N scintillator blocks are N LSO, LYSO, BGO, or GSO scintillator blocks bonded together to form the optically continuous light transfer medium using a bonding material having a refractive index of at least 1.6 for scintillation light generated by absorption of radiation in the optically continuous scintillator element. In some embodiments the N scintillator blocks have refractive index of at least 1.8 for scintillation light generated by absorption of radiation in the optically continuous scintillator element, and the N scintillator blocks are bonded together to form the optically continuous light transfer medium using a bonding material having a refractive index of at least 1.6 for the scintillation light.

One advantage resides in providing increased yield in large-area scintillator crystal production.

Another advantage resides in providing higher quality large-area scintillators

Another advantage resides in reduced large-area scintillator production cost.

Another advantage resides in providing radiation detectors with improved resolution.

Another advantage resides in providing scintillator arrays for radiation detectors having larger active area.

Numerous additional advantages and benefits will become apparent to those of ordinary skill in the art upon reading the following detailed description.

BRIEF DESCRIPTION OF THE DRAWINGS

The invention may take form in various components and arrangements of components, and in various process operations and arrangements of process operations. The drawings are only for the purpose of illustrating preferred embodiments and are not to be construed as limiting the invention.

DETAILED DESCRIPTION

Figure 1:
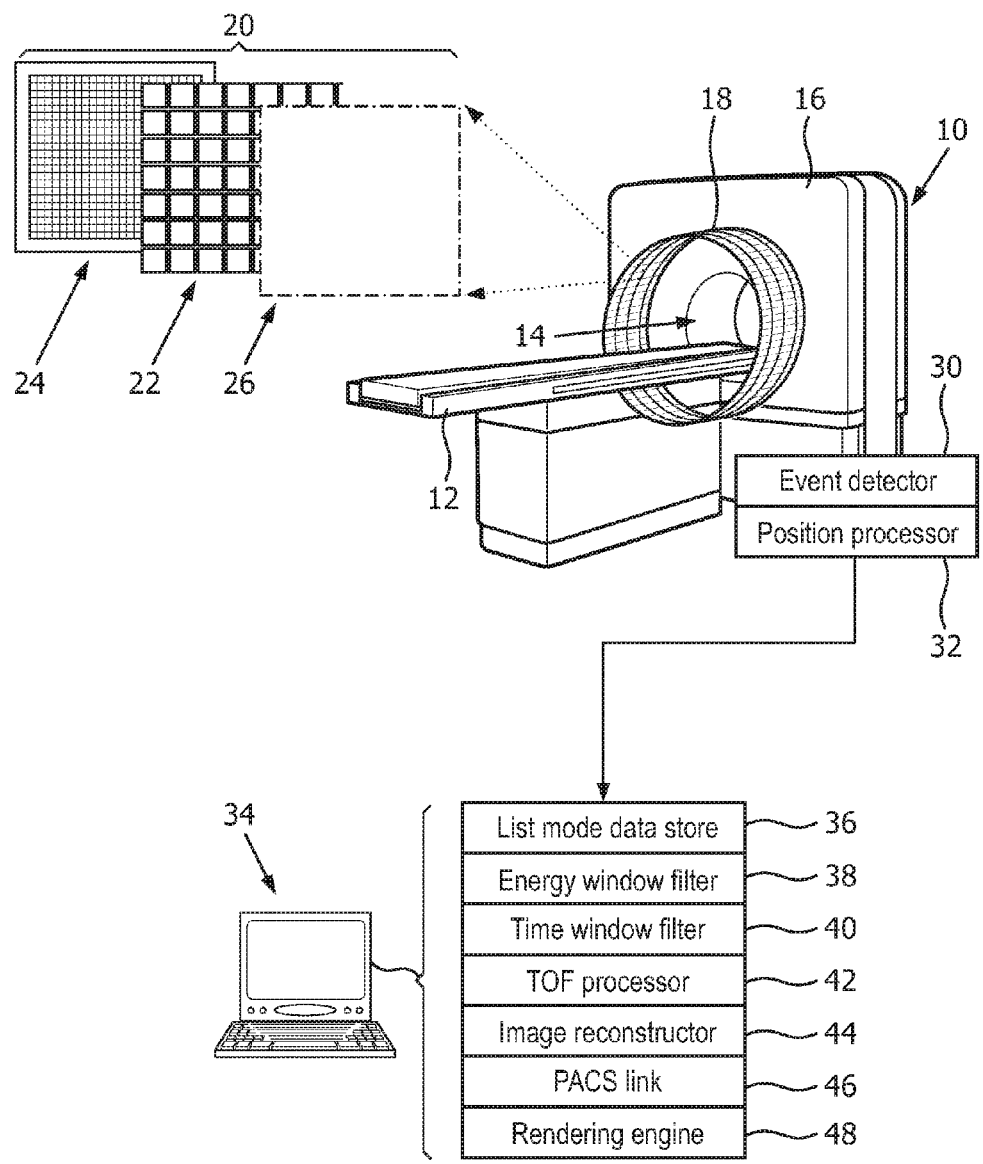
FIG. 1 diagrammatically shows a nuclear imaging system including a radiation detector employing optically continuous scintillator elements each comprising scintillator blocks bonded together to form an optically continuous light transfer medium.

With reference to FIG. 1, an illustrative positron emission tomography (PET) scanner 10 is depicted as an example of a nuclear imaging system. As another example, the imaging system could be a gamma camera (not shown) used in SPECT imaging. Moreover, it is contemplated for the disclosed radiation detector to be employed in another application, such as for detection of high energy particles for astronomical observations. The illustrative PET scanner 10 includes a subject couch or table 12 onto which a human subject or other subject (e.g. a dog, cat, or other veterinary subject, or a mummy or other deceased anthropological subject, or a mouse, guinea pig, or other preclinical testing subject) is loaded and moved by a suitable automated mechanism or by manually sliding a tabletop into the bore 14 of the PET scanner 10. The bore 14 is an opening in a housing 16 of the PET scanner 10, and a PET detector ring 18 encircles the bore 14. The PET detector ring 18 is typically disposed inside the housing 16 and hence not visible without disassembly of the PET scanner; however, for illustrative purposes the PET detector ring 18 is diagrammatically shown outside of the housing 16. In PET imaging, a radiopharmaceutical is injected into the subject. The radiopharmaceutical collects in an organ of interest, and the radiopharmaceutical includes unstable nuclei that decay in a manner that causes emission of a positron particle which then almost immediately interacts with a neighboring electron generating an electron-positron annihilation even emitting two oppositely directed 511 keV gamma particles (i.e. oppositely directed 511 keV gamma rays). Two such 511 keV detection events within a designated very short time window define coincident 511 keV detection events, and a line connecting these events is referred to as the line of response (LOR)—it is known that the particle decay event occurred somewhere along the LOR. In a time-of-flight PET variant, a small time difference measurable with sufficiently fast radiation detectors is used to further localize the particle decay event along the LOR, e.g. as a Gaussian probability distribution.

SPECT imaging is similar but in general the radiopharmaceutical emits radiation particles at characteristic energies other than 511 keV, and there is typically not an oppositely directed pair of particles emitted (hence "single photon"). To provide spatial localization, the SPECT detectors are typically arranged on movable heads with a collimator to limit particle acceptance to a line or narrow-angle cone.

With continuing reference to FIG. 1, an exploded diagrammatic representation of an illustrative radiation detector 20 is shown in an inset. The radiation detector 20 includes a scintillator element 22 made of a material that luminesces in response to absorbing a radiation particle of interest (511 keV gamma particle in the illustrative case of PET). This luminescence is referred to as a scintillation event, and the generated light is referred to herein as scintillation light. The radiation detector 20 further includes an array of light detectors 24, which may be photomultiplier tubes (PMT's) or, as in the illustrative example, an array of silicon photomultiplier (SiPM) devices monolithically fabricated on a silicon wafer or substrate. Each SiPM device includes an avalanche photodiode (APD) that is reverse-biased and normally electrically nonconductive. In response to absorbing a photon of light, the APD enters avalanche breakdown and conducts a large breakdown current, thus providing high gain. The scintillator element 22 is generally planar and has a top face facing the bore 14 to receive radiation and a bottom face on which the array of light detectors 24 is disposed so as to view the scintillator element 22 and detect scintillation light. Typically, a reflective coating or reflector layer 26 is disposed on the top face of the scintillator element 22 to reflect scintillation light emitted toward the front face backward to be detected by the light detector array 24. The reflective coating or layer 26 is thin enough so that it transmits the 511 keV radiation (or other-energy radiation in applications other than PET), and/or is made of a material that is transparent to the 511 keV radiation so that it transmits the 511 keV radiation. The reflective coating or layer 26 is reflective for the wavelength or wavelength range of the scintillation light.

With continuing reference to FIG. 1, the PET scanner 10 typically includes some on-scanner electronics, i.e. disposed in the housing 16, to perform at least initial data acquisition operations. In the illustrative example, these electronics are diagrammatically indicated as an event detector 30 that registers radiation particle detection events indexed by the radiation detector that detected the particle and by a time stamp, and a position processor 32 that more precisely determines the location of the particle absorption event using one or more techniques such as Anger logic or other lateral localization to localize the particle absorption event laterally across the array of light detectors 24 based on the relative intensities observed by the light detectors, and optional depth of interaction (DOI) localization that estimates the depth within the scintillator element 22 at which the particle was absorbed. DOI localization can rely on various metrics, such as the number of light detectors of the array 24 that detect the scintillation light (a larger number of detectors typically indicates the event was further away from the light detector array 24). The on-scanner electronics 30, 32 may be monolithically integrated on the same silicon substrate supporting the light detector array 24, or may be constructed as one or more integrated circuits (ICs) or other electronic data processing components disposed on a common printed circuit board supporting both the light detector array 24 and the on-scanner electronics 30, 32, or disposed on one or more circuit boards separate from the light detector array 24 within the housing 16.

With continuing reference to FIG. 1, PET data after processing by the on-scanner electronics 30, 32 are conveyed by suitable cabling or other communication pathway to an illustrative computer 34 or other electronic data processing component for further processing. In the illustrative example, this further processing includes storage of the PET data as list mode data in a list mode data storage 36; filtering by an energy window filter 38 which is centered on 511 keV for PET to discard detection events not corresponding to 511 keV particles; and a time window filter 40 employing a small time window to detect coincident 511 keV particle absorption events (this is a PET-specific aspect, relying upon the electron-positron annihilation event generating oppositely directed 511 keV gamma rays). If time-of-flight (TOF) PET is being implemented, then a TOF processor 42 analyzes the small time difference between the (almost) coincident 511 keV detection events to further localize the decay event along the LOR. The resulting PET data (with or without TOF localization) are input to a reconstruction processor 44 which applies a suitable reconstruction algorithm (e.g. filtered backprojection, iterative forward-backward projection, et cetera) to generate a reconstructed PET image which may be stored in a Picture Archiving and Communication Service (PACS) system via a suitable PACS link 46, and/or rendered by a rendering engine 48 for display on a display of the computer 34, or otherwise utilized.

It is to be appreciated that the illustrative division of the various processing operations between the on-scanner processing components 30, 32 and the off-scanner processing components 34 can be different from that illustrated. For example, in the illustrative embodiment the scanner outputs list mode data directly. In other embodiments, lower level data may be output from the scanner, such as analog signals from the light detectors, with analog-to-digital (A/D) conversion and the Anger and optional DOI processing being performed off-scanner.

With continuing reference to FIG. 1, in some embodiments the area of the radiation detector 20, and of the scintillator element 22 in particular, is relatively large. For example, some embodiments of the SiPM detector array are around 3×3 cm$^2$, and it is advantageous for the scintillator element 22 to be of the same 3×3 cm$^2$ area or similar. A large area is also useful in conjunction with DOI estimation to maximize detection efficiency. To see this, consider that the fraction of 511 keV gamma rays (for illustrative PET) that produce scintillation events increases with thickness t of the scintillator 22; but, increasing thickness t also increases parallax error. DOI estimation can then be used to correct for parallax, thus providing good detection efficiency via a thick scintillator without concomitant increased parallax error. But, for this to work, the area of the scintillator element 22 and of the underlying light detector array 24 should be large enough to measure the large light spread resulting from a potentially large distance between the radiation absorption event and the light detector array 24, which can be as large as the scintillator thickness t.

Figure 2:
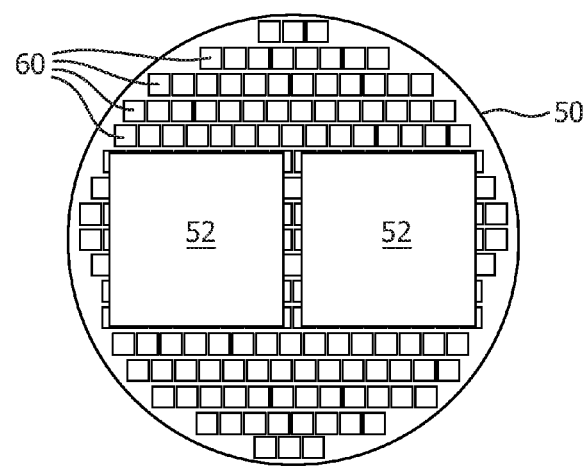
FIG. 2 diagrammatically shows a scintillator wafer or puck with inscribed areas corresponding to large-area scintillator elements and smaller areas corresponding to scintillator blocks diced from the scintillator puck in accord with scintillator element manufacturing approaches disclosed herein.

With reference to FIG. 2, the desire for the scintillator element 22 to be of large area, such as around 3×3 cm$^2$ in some embodiments, introduces substantial problems in the manufacturing process. FIG. 2 shows a round wafer (sometimes called a puck) 50 of scintillator material, which is typically cut using a diamond saw, laser cutting apparatus, or the like from a grown single-crystal boule of a scintillator crystal such as LSO (lutetium oxyorthosilicate, Lu$_2$SiO$_5$), LYSO (lutetium yttrium orthosilicate), BGO (bismuth germinate, Bi$_4$Ge$_3$O$_{12}$) or GSO (gadolinium oxyorthosilicate, Gd$_2$SiO$_5$), which is typically doped with a luminescence generating element such as cerium. Commercial crystal growers typically grow boules of 8.5 cm diameter. As seen in FIG. 2, only two 3×3 cm$^2$ regions 52 can be diced out of the 8.5 cm diameter puck 50. Much of the area of the puck 50 is waste material that does not get used. Moreover, the large size of the regions 52 increases the likelihood that one or both region 52 will contain substantial defects that would compromise performance of the scintillator element.

Figure 3:
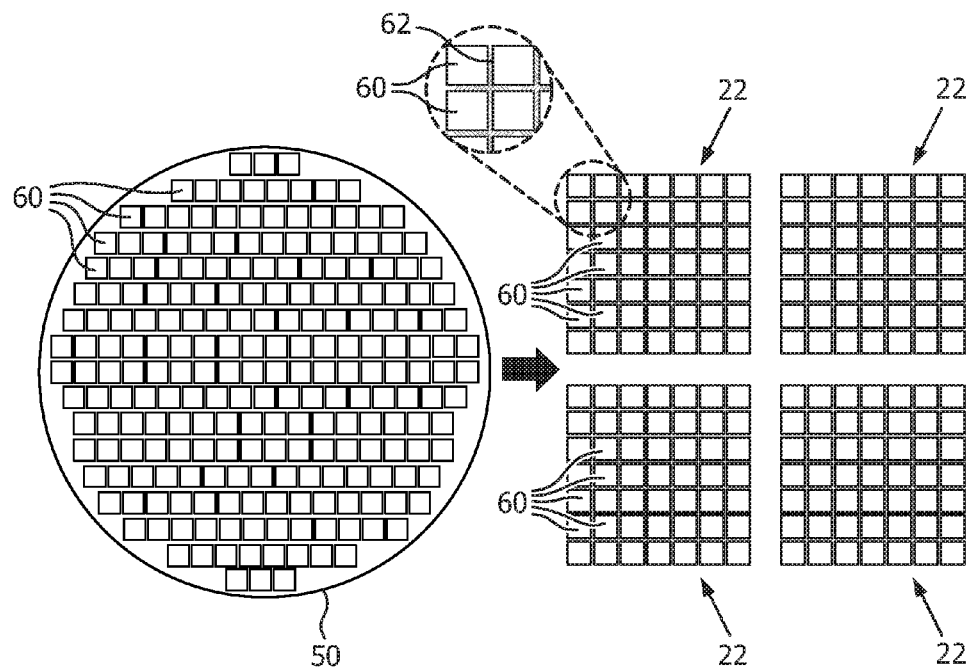
FIG. 3 diagrammatically shows an overview of a scintillator element manufacturing approach disclosed herein.

With continuing reference to FIG. 2 and with further reference to FIG. 3, in a disclosed improvement the scintillator wafer 50 is diced into scintillator blocks 60 which are substantially smaller than the large area (e.g. 3×3 cm$^2$ regions 52) of the desired scintillator element 22. As diagrammatically shown in FIG. 3, an array of N of these scintillator blocks 60 is assembled to form one scintillator 22. The diced scintillator blocks 60 have thickness t equal to the thickness of the puck 50. The assembled scintillator also has thickness t, but has area N times the area of a single one of the scintillator blocks 60 (or a slightly larger area than that due to gaps between adjacent scintillator blocks 60 of the array; moreover, it is contemplated for the scintillator blocks to have different areas, or in other words the scintillator blocks may not be all cut to the same size).

As a quantitative example, consider an embodiment of the scintillator element 22 having thickness t=2.2 cm and area 3.2 cm×3.2 cm. In the illustrative example, this is formed by a 7×7 array of scintillator blocks 60 (so that N=49). As best seen in FIG. 3, up to 238 scintillator blocks 60 can be diced from the 8.5 cm diameter puck 50. With N=49 it follows that up to rounddown(238/49)=4 scintillator elements 22 can be formed from the 8.5 cm diameter puck 50, with remainder (238/49)=42 scintillator blocks 60 left over. This, by itself, results in a twofold yield increase compared with the conventional approach of dicing the 3.2 cm×3.2 cm scintillator element directly.

However, the yield increase is likely to be substantially larger even than this, because a substantial fraction of directly diced 3.2 cm×3.2 cm scintillator elements are likely to be unusable due to material defects somewhere in the large area. In contrast, in the approach of FIG. 3 in which smaller scintillator blocks 60 are assembled as an array, such material defects are likely to be isolated to one or at most a few of the scintillator blocks 60, and these defective blocks can be discarded. In the quantitative example, dicing the puck 50 provides 42 "leftover" scintillator blocks 60, which can be used in place of any defective scintillator blocks or can be used in combination with scintillator blocks diced from another scintillator puck.

For some spatial position refinement techniques such as Anger logic or typical DOI algorithms, the scintillator element 22 should be optically continuous over its volume (e.g. volume t×A for thickness t and area A equal to N times the area of a single scintillator block 60) for scintillation light generated by a radiation absorption event occurring in the scintillator element. To achieve this, a transparent or translucent material 62 is disposed between adjacent scintillator blocks 60 of the array making up the scintillator element 22. (See inset of FIG. 3). No reflective or opaque material is disposed between adjacent scintillator blocks 60 of the array making up the scintillator element 22. To limit light reflection or scattering at interfaces between the scintillator blocks 60 and the transparent or translucent material 62 is disposed between adjacent scintillator blocks 60, the transparent or translucent material 62 should provide refractive index matching between the scintillator blocks 60. Typical scintillator materials such as LSO, BGO, GSO, or LYSO have refractive index of greater than or equal to 1.8, e.g. n in the case of the aforementioned scintillator materials. To provide refractive index matching the transparent or translucent material 62 should have refractive index of n=1.6 or higher. By "transparent or translucent" it is meant that scintillator light absorption losses in the transparent or translucent material 62 should be low, although some such losses are contemplated. The transparent or translucent material 62 disposed between adjacent scintillator blocks 60 should be thin so that the bulk of the material of the scintillator element 22 is made up of the scintillator material of the scintillator blocks 60. The fractional absorption at one interface between adjacent scintillator blocks 60 is roughly equal to $e^{-\alpha x}$ where $\alpha$ is the attenuation coefficient of the transparent or translucent material 62 and x is the light path length through the material 62, which is its thickness for normal incidence). Thus, while $\alpha=0$ (complete transparency) is ideal for the material 62, a translucent material ($\alpha>0$ but still small) is acceptable since the path length x is already small. Light scattering at interfaces between adjacent scintillator blocks 60 should also be minimized, and this is suitably accomplished by polishing the facets of the scintillator blocks 60 before assembling the scintillator element 22 (for example using mechanical polishing or chemically assisted mechanical polishing) and by providing the refractive index matching transparent or translucent material 62 disposed between adjacent scintillator blocks 60. It should be noted that the foregoing optical characteristics (e.g. refractive index n, attenuation coefficient $\alpha$, light scattering characteristics) of the optically continuous scintillator element 22 are for the wavelength or wavelength range of the scintillation light generated by the scintillator blocks 60 in response to absorption of a radiation particle (e.g. in response to absorption of a 511 keV gamma ray in the illustrate case of PET imaging).

Figure 4:
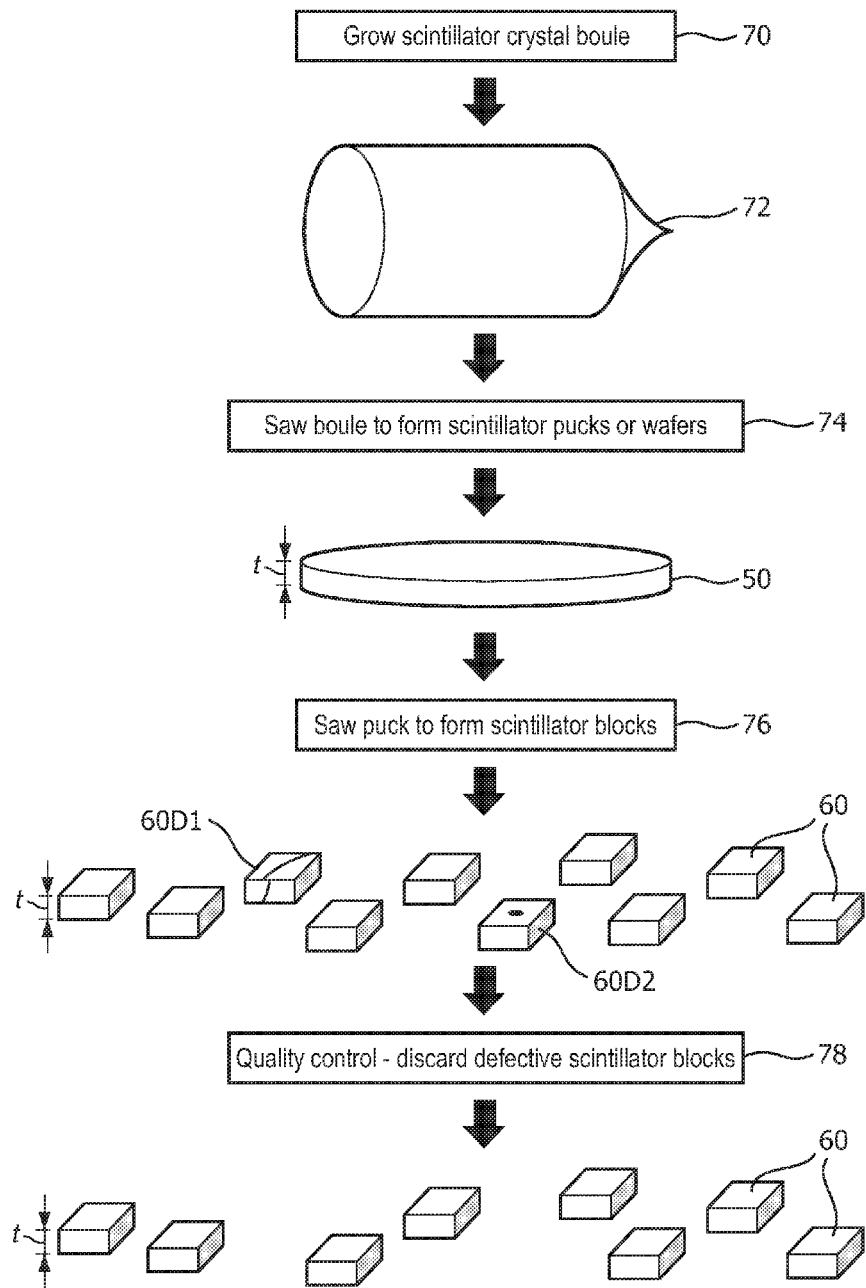
FIGS. 4-6 diagrammatically show illustrative embodiments of scintillator element manufacturing approaches disclosed herein.
Figure 5:
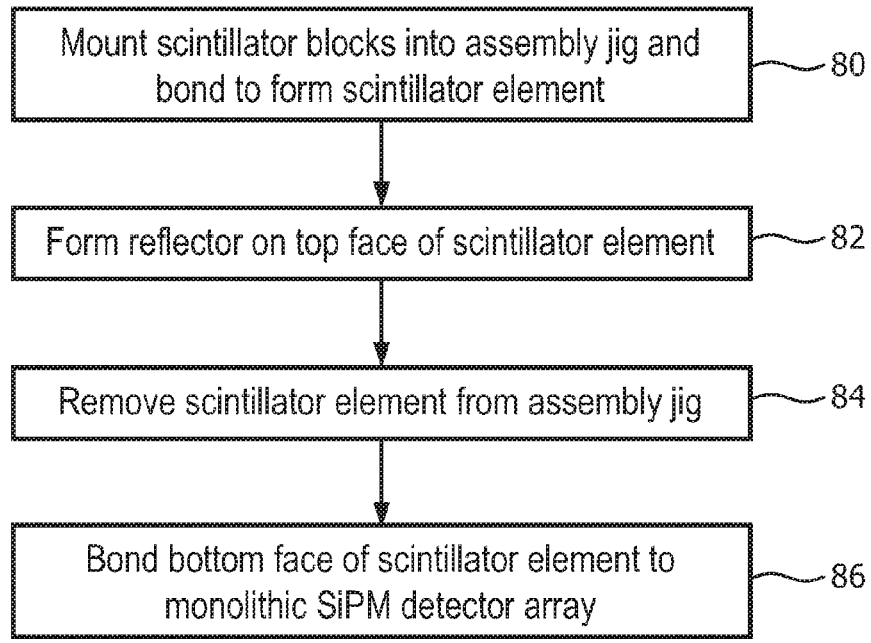
Figure 6:
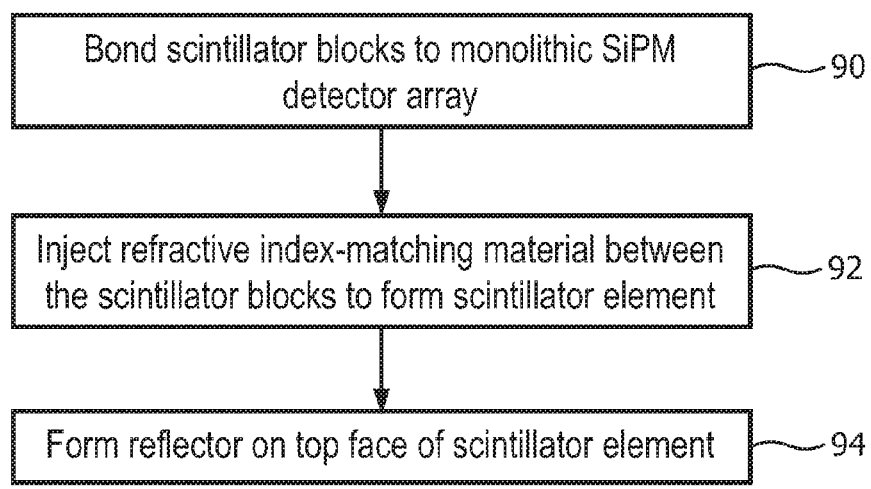

With reference to FIGS. 4-6, some approaches for constructing the scintillator element 22 are described. Starting with FIG. 4, in an operation 70 a boule 72 of the scintillator material (e.g. LSO, BGO, GSO, LYSO, or another chosen material) is grown using a suitable approach such as the Czochralski process or another bulk crystal growth technique. A desired concentration of cerium or other dopant(s) is incorporated into the scintillator crystal boule 72 during its growth, e.g. by including the desired concentration of dopant in the initial source melt. In an operation 74 the boule 72 is cut using a diamond saw, laser cutting apparatus, or the like to generate wafers or pucks of the scintillator material including the illustrative scintillator wafer or puck 50 of thickness t whose subsequent processing is described. In an operation 76 the scintillator puck 50 is diced using a diamond saw, laser cutting apparatus, or the like to generate the scintillator blocks 60 of thickness t. Preferably, in one or more quality control operations 78 the scintillator blocks 60 are inspected visually or using automated inspection equipment (e.g. machine vision, optical characterization apparatuses, et cetera). In illustrative FIG. 4, this inspection results in discarding an illustrative two defective scintillator blocks 60D1, 60D2 due to a linear or planar defect in the scintillator block 60D1 and a volume (or large point) defect in the scintillator block 60D2. Although diagrammatic FIG. 4 shows only a few diced scintillator blocks 60, it should be noted that the number of diced scintillator blocks 60 prior to inspection is typically substantially larger, e.g. 238 scintillator blocks 60 in the illustrative embodiment of FIGS. 2 and 3.

With reference to FIGS. 5 and 6, various approaches can be used to assemble one or more (e.g. four in FIG. 3) scintillator elements 22 from the diced scintillator blocks 60 remaining after the optional inspection operation 78 of FIG. 4.

The illustrative approach of FIG. 5 produces the scintillator element 22 as a freestanding scintillator element capable of supporting its own weight, in which the scintillator blocks 60 of the array are held together by the transparent or translucent material 62 which comprises a bonding material such as epoxy or glue. In an operation 80, N scintillator blocks 60 are assembled into the desired array using a suitable assembly jig, and are bonded together to form the scintillator element 22. The bonding material 62 of this embodiment may be applied to the sidewalls of the scintillator blocks 60 prior to their placement into the assembly jig, or alternatively the scintillator blocks 60 are first placed into the jig with spacer sheets in-between the scintillator blocks 60, after which the spacer sheets are removed and the transparent or translucent epoxy or glue 60 is injected into (or otherwise disposed in) the gaps between the scintillator blocks 60. In an operation 82, the reflector 26 (see inset of FIG. 1 showing exploded view of the radiation detector 20) is formed on the top face of the assembled and bonded scintillator element 22. This can be done in various ways, such as by evaporation, or by gluing a reflective sheet onto the top face of the scintillator element 22. In an operation 84, the assembled and bonded scintillator element 22 is removed from the jig. (This removal can be done before or after operation 82 applying the reflector 26, depending upon the method of operation 82. The bottom face of the freestanding scintillator element 22 is then bonded to the monolithic SiPM light detector array 22 (see inset of FIG. 1 again) in an operation 86. More generally, the operation 86 may be performed before operation 82.

In the assembly approach of FIG. 5, the assembled scintillator element 22 is a freestanding scintillator element capable of supporting its own weight, in which the scintillator blocks 60 of the array are held together by the transparent or translucent material 62 which comprises a bonding material such as epoxy or glue. Accordingly, in the operation 86 the scintillator element 22 is bonded as a freestanding unit to the SiPM array 24.

On the other hand, in the embodiment of FIG. 6, the SiPM array 24 serves as a common substrate to which the N scintillator blocks are bonded, and the transparent or translucent material 62 disposed between adjacent scintillator blocks of the array is not relied upon to provide sufficient support for the scintillator element 22 to be freestanding. In the embodiment of FIG. 6 the transparent or translucent material 62 provides refractive index matching to make the scintillator element 22 an optically continuous element, but the transparent or translucent material 62 is not necessarily a bonding material (although it may be a bonding material). The assembly approach of FIG. 6 also optionally does not employ an assembly jig. The assembly approach of FIG. 6 starts in an operation 90 by bonding the scintillator blocks 60 to the monolithic SiPM array 24 to form the array of N scintillator blocks 60. In an operation 92, the refractive index-matching transparent or translucent material 62 is injected or otherwise disposed between adjacent scintillator blocks 60 of the array to complete formation of the optically continuous scintillator element 22. In an operation 94, the reflector 26 is formed; this operation is analogous to operation 82 of the assembly approach of FIG. 5.

The operation 80 of FIG. 5, or the operation 92 of FIG. 6, may include a curing operation comprising heating, exposure to ultraviolet light, or so forth in order to cure the transparent or translucent material 62. For example, in the approach of FIG. 5 using epoxy as the transparent or translucent material 62, a curing operation may be employed to harden the epoxy.

With returning reference to FIG. 1, the radiation detection component (e.g. PET detector ring 18) typically includes an array of the scintillator elements 22. As already noted, each scintillator element 22 is constructed to be an optically continuous element for the scintillation light. Optionally, the outer periphery of each scintillator element 22 is free of any reflective or opaque material and is abutted to adjacent scintillator elements 22 in array forming the radiation detection component 18. In such a case, the array of scintillator elements 22 itself forms an optically continuous medium for the scintillation light. Accordingly, the position processor 32 may be configured to locate a radiation absorption event occurring in one scintillator element 22 of the array of scintillator elements based on detection of scintillation light generated by the radiation absorption event and passing through at least two scintillator elements of the array of scintillator elements.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. An apparatus comprising:
   a scintillator element including:
      N scintillator blocks of thickness t, which are diced from a scintillator wafer or puck, arranged to form an array of thickness t; and
      a transparent or translucent epoxy or glue disposed between adjacent scintillator blocks of the array and adhering the adjacent scintillator blocks together;
   wherein the scintillator element is a freestanding scintillator element capable of supporting its own weight, in which the scintillator blocks of the array are held together by the transparent or translucent epoxy or glue; and
   wherein no reflective or opaque material is disposed between adjacent scintillator blocks of the array; and
   wherein the scintillator element is one of R scintillator elements constructed from a scintillator wafer or puck where R is greater than or equal to two and the R scintillator elements could not be diced as R single-piece scintillator elements from the scintillator wafer or puck.

2. The apparatus of claim 1 wherein no reflective or opaque material is disposed between adjacent scintillator blocks of the array.

3. The apparatus of claim 1 wherein:
   the N scintillator blocks of the array are capable of generating scintillation light responsive to absorption of a radiation particle and have a refractive index for the scintillation light of at least n=1.8; and
   the transparent or translucent epoxy or glue disposed between adjacent scintillator blocks of the array has a refractive index for the scintillation light of at least n=1.6.

4. The apparatus of claim 1 further comprising:
   a reflective layer disposed on a top face of the scintillator element over all N scintillator blocks of the array.

5. The apparatus of claim 1 further comprising:
   an array of light detectors disposed on a bottom face of the scintillator element and arranged to detect scintillation light generated in the scintillator element.

6. The apparatus of claim 5 wherein the array of light detectors comprises an array of silicon photomultiplier (SiPM) detectors formed monolithically on a silicon substrate.

7. The apparatus of claim 5 wherein the scintillator element and the array of light detectors define a radiation detector configured to detect 511 keV radiation.

8. The apparatus of claim 5 wherein the N scintillator blocks are N blocks of LSO, BGO, GSO, or LYSO.

9. The apparatus of claim 5 further comprising:
   an imaging system including:
      a radiation detection component, and
      an image reconstruction processor comprising an electronic data processing component configured to reconstruct an image from radiation data acquired by the radiation detection component;
   wherein the scintillator element and the array of light detectors define at least one radiation detector of the radiation detection component of the imaging system.

10. The apparatus of claim 9 wherein the imaging system is a positron emission tomography (PET) imaging system or a single photon emission computed tomography (SPECT) imaging system.

11. The apparatus of claim 9 wherein the imaging system further comprises:
    a depth of interaction (DOI) processor comprising an electronic data processing component configured to estimate the depth over the thickness t of the scintillator element at which a radiation absorption event occurred based on detection by the array of radiation detectors of scintillation light generated in the scintillator element by the radiation absorption event.

12. The apparatus of claim 9 wherein the imaging system further comprises:
a position processor comprising an electronic data processing component configured to locate a radiation absorption event based on detection by the array of radiation detectors of scintillation light generated in the scintillator element by the radiation absorption event.

13. The apparatus of claim 12 wherein the position processor is configured to locate the radiation absorption event using Anger logic.

14. The apparatus of claim 1 wherein the position processor is configured to locate a radiation absorption event occurring in one scintillator element of the array of scintillator elements based on detection of scintillation light generated by the radiation absorption event and passing through at least two scintillator elements of the array of scintillator elements.

15. The apparatus of claim 1 wherein the array of scintillator blocks of thickness t has an area A and the scintillator element is optically continuous over the volume t×A for scintillation light generated by a radiation absorption event occurring in the scintillator element.

16. A method comprising:
constructing R scintillator elements where R is greater than or equal to two by operations including:
    dicing a scintillator wafer or puck to generate scintillator blocks of thickness t;
    forming each scintillator element by assembling N of the scintillator blocks of thickness t to form an array of thickness t and disposing transparent or translucent epoxy or glue between adjacent scintillator blocks of the array to adhere the blocks together;
wherein the scintillator element is a freestanding scintillator element capable of supporting its own weight, in which the scintillator blocks of the array are held together by the transparent or translucent epoxy or glue;
wherein the operations performed to construct the R scintillator elements do not include disposing any reflective or opaque material between adjacent scintillator blocks of the array; and
wherein the R scintillator elements could not be diced as R single-piece scintillator elements from the scintillator wafer or puck.

17. The method of claim 16 wherein the transparent or translucent material is transparent or translucent bonding material and the disposing comprises:
bonding adjacent scintillator blocks of the array together using the transparent or translucent bonding material.

18. The method of claim 16 wherein the operations performed to construct the scintillator element further include:
after the dicing, examining the scintillator blocks; and
discarding at least some scintillator blocks which are determined to be defective based on the examining;
wherein the assembling operates on N scintillator blocks taken from the set of scintillator blocks remaining after the discarding operation.

19. The method of claim 16 wherein the disposing operation comprises disposing refractive index-matching transparent or translucent material between adjacent scintillator blocks of the array to construct the scintillator element as an optically continuous scintillator element.

20. The method of claim 16 further comprising:
disposing a reflective layer on a top face of the scintillator element over all N scintillator blocks of the array.

21. The method of claim 16 wherein the scintillator element is constructed by operations further including:
cutting a boule of scintillator material to generate the scintillator wafer or puck.

22. A method comprising:
constructing R scintillator elements where R is greater than or equal to two by operations including:
    dicing a scintillator wafer or puck to generate scintillator blocks of thickness t;
    assembling the scintillator blocks diced from the scintillator wafer or puck to form R scintillator elements each of thickness t; and
    disposing transparent or translucent material between adjacent scintillator blocks of each scintillator element of the R scintillator elements;
wherein the R scintillator elements could not be diced as R single-piece scintillator elements from the scintillator wafer or puck.

23. The method of claim 22 wherein the transparent or translucent material is transparent or translucent bonding material and the disposing comprises:
bonding adjacent scintillator blocks of each scintillator element together using the transparent or translucent bonding material.

24. The method of claim 22 wherein the assembling includes:
bonding the scintillator blocks of each scintillator element to a common substrate.

25. The method of claim 24 wherein the common substrate comprises a monolithic array of silicon photomultiplier (SiPM) light detectors.

26. The method of claim 24 wherein the disposing operation comprises disposing refractive index matching transparent or translucent material between adjacent scintillator blocks of each scintillator element to construct the scintillator element as an optically continuous scintillator element.

* * * * *